United States Patent [19]

Ichinohe et al.

[11] 3,742,262

[45] June 26, 1973

[54] TRANSISTOR DETECTING CIRCUIT

[75] Inventors: Eisuke Ichinohe, Kitakawachi-gun, Osaka; Noriyoshi Kubo, Asahi-ku, Yokohama; Kazuhiro Nakamura, Kohoku-ku, Yokohama; Yoshinori Endo, Midori-ku, Yokohama; Takeshi Katano, Kawasaki-shi, all of Japan

[73] Assignee: Matsushita Electric Industrial Co., Lt.d, Osaka, Japan

[22] Filed: Sept. 16, 1971

[21] Appl. No.: 181,033

[30] Foreign Application Priority Data

Sept. 18, 1970 Japan .............................. 45/82355

[52] U.S. Cl. .............................. 307/310, 307/296

[51] Int. Cl. .............................. H03k 17/00

[58] Field of Search .................... 307/310, 296, 297; 330/23

[56] References Cited

UNITED STATES PATENTS

| | | | |
|---|---|---|---|
| 2,892,165 | 6/1959 | Lindsay | 330/23 X |
| 2,929,997 | 3/1960 | Clawen | 330/23 X |
| 3,452,281 | 6/1969 | Weischedel | 330/23 X |
| 3,585,511 | 6/1972 | Schatter | 307/310 X |

*Primary Examiner*—Herman Karl Saalbach
*Assistant Examiner*—B. P. Davis
*Attorney*—Stevens, Davis, Miller & Mosher

[57] ABSTRACT

A transistor detecting circuit provided with a detecting sensitivity compensation transistor circuit having a compensation transistor and a resistance circuit connected between the base and collector of the compensation transistor, said compensation transistor circuit being provided in the input circuit leading to a detecting transistor.

2 Claims, 3 Drawing Figures

TRANSISTOR DETECTING CIRCUIT

BACKGROUND OF THE INVENTION

1. Field of the Invention

This invention relates to transistor detecting circuits, and its aim is to obtain steady detection sensitivity irrespective of temperature changes.

2. Description of the Prior Art

FIG. 1 shows a typical prior-art transistor detecting circuit, to which the invention pertains. It comprises a detecting transistor $TR_1$, a rectifying capacitor $C_1$, a d-c block capacitor $C_2$, a d-c clamp resistor $R_1$ for clamping the d-c component of the input signal and a collector load resistor $R_2$.

In this circuit, if $Z_{in} >> R_s$ where $Z_{in}$ is the impedance with respect to the transistor $TR_1$ and $R_s$ is the input impedance of a signal source E, the condition for the input signal e from the signal source E to be detected as it is impressed across the base and emitter of the detecting transistor $TR_1$ is expressed as $$e \geqq V_{BE}, \tag{1}$$

where $V_{BE}$ is the potential difference between the base and emitter of the transistor $TR_1$.

The voltage $V_{BE}$ is subject to changes with changing temperature. This means that the detection sensitivity of the transistor detecting circuit of the above construction also changes with a change in temperature.

SUMMARY OF THE INVENTION

An object of the invention is to provide a transistor detecting circuit provided with a detection sensitivity compensation transistor circuit consisting of a transistor and a resistance circuit connected between the base and collector of the transistor, said transistor circuit being provided in the input circuit leading to the detecting transistor, thereby ensuring steady detection sensitivity irrespective of temperature changes.

DESCRIPTION OF THE PREFERRED EMBODIMENT

Figure 1:
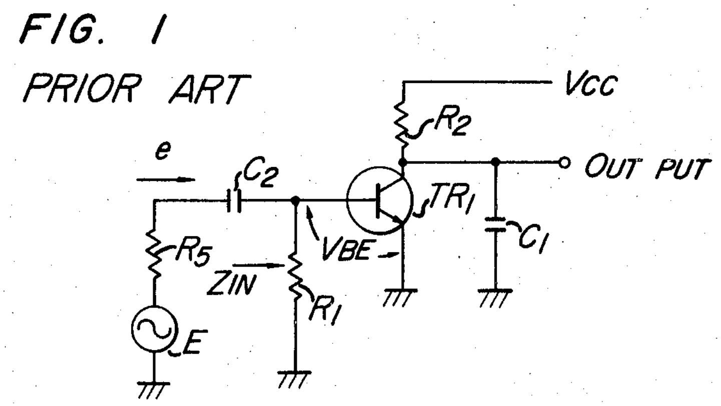
FIG. 1 PRIOR ART
FIG. 1 is a circuit diagram showing a conventional transistor detecting circuit.
Figures 2, 3:
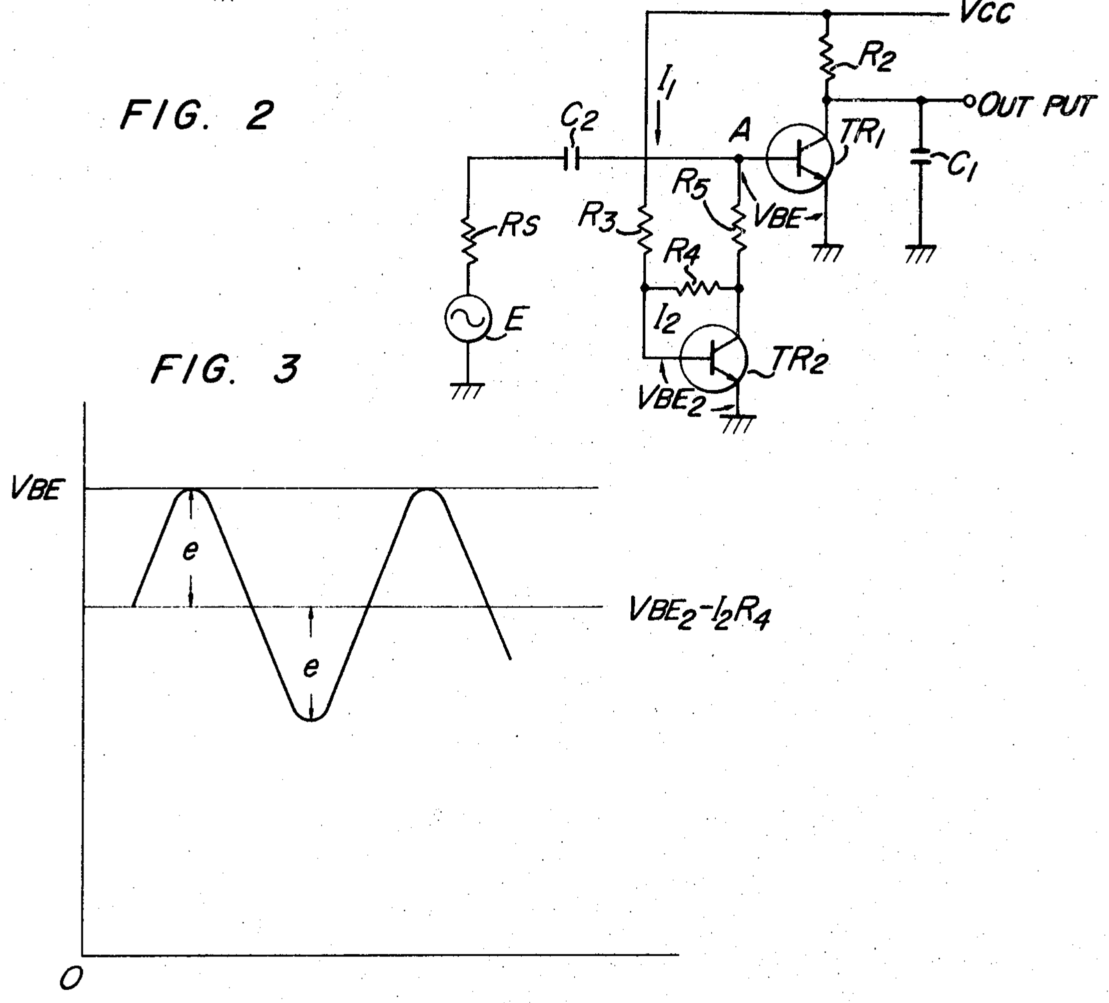
FIG. 2 is a circuit diagram showing an embodiment of the transistor detecting circuit according to the invention.
FIG. 3 is a graph showing the detection sensitivity characteristic of the circuit FIG. 2.

FIG. 2 shows an embodiment of the transistor detecting circuit according to the invention. This circuit includes a transistor circuit which consists of a transistor $TR_2$ and resistors $R_3$, $R_4$ and $R_5$ and which replaces the resistor $R_1$ in the prior-art circuit of FIG. 1.

In this circuit construction, if $R_3I_1 >> V_{BE2}$ where $R_3$ is the resistance of the resistor $R_3$, $I_1$ is the current therethrough and $V_{BE2}$ is the potential difference between the base and emitter of the transistor $TR_2$, $R_3I_1$ can be regarded as a constant current source.

For the input signal e to be detected by the transistor $TR_1$, the following condition is required.

$$e + V_{BE2} - I_2R_4 \geqq V_{BE}, \tag{2}$$

This relation is illustrated in FIG. 3.

The inequality 2 is based on the assumption that the resistor $R_5$ offers infinitely high resistance and carries no current.

In the absence of the input signal e to the transistor $TR_1$, the transistor $TR_1$ is cut off providing no base current, so that no voltage drop is produced across the resistor $R_5$. In this state, the potential at point A is equal to the collector potential of the transistor $TR_2$, so that the inequality 2 is satisfied.

If $V_{BE} = V_{BE2}$, the inequality 2 reduces to $$e \geqq I_2R_4, \tag{3}$$

As is apparent from the inequality 3, the detection sensitivity does not depend upon the base-emitter voltage of the transistors $TR_1$ and $TR_2$.

Since $R_4$ in the inequality 3 is constant, the detection sensitivity solely depends upon $I_2$.

Since $I_1 = (V_{CC} - V_{BE2})/R_3$ and $I_1 = I_2(1 + 1/\beta)$ where $\beta$ is the current gain of the transistor $TR_2$, $$I_2 = (V_{CC} - V_{BE2})/[R_3(1 + 1/\beta)], \tag{4}$$

Substitution of the equation 4 to the inequality 2 gives $$e \geqq (R_4/R_3) \cdot (V_{CC} - V_{BE2})/(1 + 1/\beta), \tag{5}$$

If $\beta >> 1$, the denominator of the second factor $(V_{CC} - V_{BE2}/1 + 1/\beta)$ on the right side of the inequality 5 is substantially at unity, so that the detection sensitivity is not affected by $\beta$.

Also, if $R_4$ and $R_3$ fluctuate in the same direction, their effects cancel and have no effect on the detection sensitivity.

If $V_{CC} >> V_{BE2}$, fluctuation of the base-emitter voltage $V_{BE2}$ of the transistor $TR_2$ has no effect.

Further, it will be apparent from the inequality 5 that the detection sensitivity can be varied by varying the resistances $R_3$ and $R_4$.

As has been described, according to the invention it is possible to obtain a transistor detecting circuit having a steady sensitivity characteristic immune to the influence of temperature.

We claim;

1. A temperature-compensated detecting circuit comprising
   - a detecting transistor having its emitter and collector electrodes coupled between an output terminal and ground, the base electrode of said detecting transistor being coupled to an input terminal for receiving an input signal,
   - a series circuit comprising a compensation transistor and a first resistor connected between the base of said detecting transistor and ground, said first resistor having a relatively large resistance value,
   - means for providing a constant current to the base of said compensation transistor, and
   - a second resistor connected between the base and collector electrodes of said compensation transistor for coupling therewith.

2. A detecting circuit according to claim 1 wherein detection is performed under the condition $$e + V_{BE2} - I_2R_4 \geqq V_{BE},$$

where $e$ is the input signal to be detected, $V_{BE2}$ is the potential difference between the base and the emitter of said compensation transistor, $V_{BE}$ is the potential difference between the base and the emitter of said detecting transistor, $R_4$ is the resistance of said second resistor connected between the base and the collector of said compensation transistor, and $I_2$ is the current through resistor $R_4$.

* * * * *